(12) United States Patent
Proepper

(10) Patent No.: US 11,037,867 B2
(45) Date of Patent: Jun. 15, 2021

(54) SEMICONDUCTOR MODULE

(71) Applicant: Robert Bosch GmbH, Stuttgart (DE)

(72) Inventor: Thomas Proepper, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/610,947

(22) PCT Filed: Apr. 25, 2018

(86) PCT No.: PCT/EP2018/060603
§ 371 (c)(1),
(2) Date: Nov. 5, 2019

(87) PCT Pub. No.: WO2018/202509
PCT Pub. Date: Nov. 8, 2018

(65) Prior Publication Data
US 2020/0058575 A1 Feb. 20, 2020

(30) Foreign Application Priority Data

May 5, 2017 (DE) ...................... 10 2017 207 564.3

(51) Int. Cl.
*H01L 23/495* (2006.01)
*H01L 23/051* (2006.01)

(52) U.S. Cl.
CPC ...... *H01L 23/49562* (2013.01); *H01L 23/051* (2013.01); *H01L 23/49537* (2013.01); *H01L 23/49568* (2013.01); *H01L 23/49575* (2013.01)

(58) Field of Classification Search
CPC ............. H01L 23/49562; H01L 23/051; H01L 23/49537; H01L 23/49568; H01L 23/49575
(Continued)

(56) References Cited

U.S. PATENT DOCUMENTS

2009/0189259 A1 7/2009 Mohamed et al.
2010/0078783 A1* 4/2010 Otremba ............... H01L 25/115
257/676

(Continued)

FOREIGN PATENT DOCUMENTS

DE 102009006152 7/2009
EP 2546874 1/2013
(Continued)

OTHER PUBLICATIONS

International Search Report for Application No. PCT/EP2018/060603 dated Jul. 17, 2018 (English Translation, 3 pages).

*Primary Examiner* — Tong-Ho Kim
(74) *Attorney, Agent, or Firm* — Michael Best & Friedrich LLP

(57) ABSTRACT

A semiconductor module has at least two semiconductor components which are arranged within a housing in each case between two electrical conduction elements and are electrically conductively connected to the electrical conduction elements. The electrical conduction elements respectively have a contact extension that is led out of the housing, wherein two contact extensions arranged in different planes are connected to one another outside the housing via a contact element, which forms a current path between the two contact extensions outside the housing.

14 Claims, 4 Drawing Sheets

(58) Field of Classification Search
USPC .......................................................... 257/666
See application file for complete search history.

(56) References Cited

U.S. PATENT DOCUMENTS

2013/0146991 A1* 6/2013 Otremba ................. H01L 24/96
257/401
2014/0361420 A1 12/2014 Yilmaz et al.

FOREIGN PATENT DOCUMENTS

| JP | 2007035670 A | | 2/2007 |
|----|--------------|---|--------|
| JP | 2011086889 A | | 4/2011 |
| JP | 2013021318 A | | 1/2013 |
| JP | 2013101993 A | * | 5/2013 |
| JP | 2013101993 A | | 5/2013 |
| WO | 2014206693 | | 12/2014 |

* cited by examiner

SEMICONDUCTOR MODULE

BACKGROUND OF THE INVENTION

The invention is based on a semiconductor module.

The prior art discloses semiconductor modules embodied as integrated half-bridge circuits (B2) in molded housings, said semiconductor modules being constructed for example as "leadless chip-scale packages". This design is intended for example for constructing power electronic pulse-controlled inverter assemblies on printed circuit boards. The molded housing terminates flush with exposed surfaces of electrical conduction elements by which the half-bridge circuit is soldered onto the printed circuit board. The electrical conduction elements can be embodied as leadframes, for example. In this "leadless" design, the electrical conduction elements of the half-bridge circuits do not extend beyond the outer boundaries of the molded housing. The half-bridge circuit comprises two transistors, which are arranged within a housing in each case between two electrical conduction elements and are electrically conductively connected to the electrical conduction elements. Currents from the half-bridge circuit flow via the printed circuit board, where they generate high power loss densities in direct proximity to the exposed surfaces of the electrical conduction elements. The phase current of the half-bridge circuit that is introduced into the circuit carrier is connected there, by means of a tap, to the phase current wire which transitions into a stator winding of a connected electrical machine.

A current bridge between a drain terminal of a first, low-side, transistor and a source terminal of a second, high-side, transistor in half-bridge circuits known from the prior art produces a high-side conduction element which is soldered to a source electrode of the high-side transistor at one end and to a drain electrode of the low-side transistor at the other end, at a soldered joint having a significantly smaller current cross section. From thermal and thermomechanical standpoints, this solder or else bond connection is critical on account of the high local current and power loss densities in the region of the soldered joint; it entails a significant reliability risk as a result of failure of the current bridge owing to soldered joint fracture or soldered joint cracking and mold delamination.

DE 10 2009 006 152 A1 discloses an electronic component comprising a leadframe, a first semiconductor chip, a second semiconductor chip and a metallic clip, which are surrounded by a molded housing. The first semiconductor chip is applied by a first surface on the leadframe. The metallic clip is bent in an S-shaped fashion and connects a second surface of the first semiconductor chip, which is situated opposite the first surface, to a first surface of the second semiconductor chip, wherein the first surface of the second semiconductor is arranged in a different plane of the electronic component. A second surface of the second semiconductor chip can be connected to a second metallic clip. The metallic clips can be produced by stamping, embossing, pressing, cutting, sawing, milling.

SUMMARY OF THE INVENTION

The semiconductor module according to the invention has the advantage that a current bridge between the two semiconductor chips is closed outside the housing. As a result, a current constriction in the contact attachment of the electrical conduction element and an associated reliability risk as a result of high electric current densities and temperature swings can advantageously be eliminated. Embodiments of the semiconductor module according to the invention can advantageously be embodied as half-bridge circuits and be provided for construction on an electronic circuit carrier which is combined with an electrical machine directly to form a "power pack". Advantageously, a phase potential tap of the corresponding half-bridge circuit can be directly connected to a phase current wire of a stator winding of the electrical machine, without passing the phase current through the circuit carrier on which the semiconductor module is arranged. Furthermore, embodiments of the semiconductor module according to the invention can provide an electrical bridge path having low inductance, such that the half-bridge circuits can advantageously be used in pulse-controlled inverter circuits having a high PWM frequency (PWM: pulse width modulation) and miniaturized passive components.

Moreover, the current path led outside the housing advantageously eliminates the heat input with high power loss density in the interior of the semiconductor module and the attendant reliability risks as a result of delamination of the molded housing, soldered joint fractures, torn away bonds, etc. Embodiments of the proposed semiconductor module have no current constrictions in the interior and accordingly have a significantly higher electrical and thermal loading capacity with at least the same reliability and lifetime as comparable power semiconductor modules of conventional design.

The electrodes, terminals and dimensions of the semiconductors of the half-bridge can advantageously be embodied such that they are of the same size, with the result that theoretically it is possible to apply a maximum current load for a predefined total chip area and permissible maximum temperature. Moreover, the phase tap can be positioned centrally in the current path of the half-bridge. The electrical layers of the two semiconductor components of the half-bridge can be constructed congruently and electrically symmetrically with respect to one another.

Embodiments of the present invention provide a semiconductor module comprising at least two semiconductor components which are arranged within a housing in each case between two electrical conduction elements and are electrically conductively connected to the electrical conduction elements. In this case, the electrical conduction elements respectively have a contact extension that is led out of the housing. Moreover, two contact extensions arranged in different planes are connected to one another outside the housing via a contact element, which forms a current path between the two contact extensions outside the housing.

It is particularly advantageous that the contact element can be connected for example to the contact extensions by means of soldering, resistance or laser welding, insulation-displacement connection, crimping or press-fit connection. Of course, other suitable connection techniques can also be used in order to electrically connect the contact extensions to the contact element and to form the corresponding current path.

In one advantageous configuration of the semiconductor module, the at least two semiconductor components can be embodied as power semiconductor components which have the same area requirement and form a half-bridge circuit for an electrical machine. In this regard, the semiconductor components can be embodied for example as IGBTs (Insulated Gate Bipolar Transistors), MOSFETs (Metal-Oxide-Semiconductor Field-Effect Transistors), etc.

In a further advantageous configuration of the semiconductor module, a first electrical conduction element of the first semiconductor and a first electrical conduction element of the second semiconductor can be formed in each case as a drain terminal or a collector terminal, and a second electrical conduction element of the first semiconductor and a second electrical conduction element of the second semiconductor can be formed in each case as a source terminal or an emitter terminal. Furthermore, the two drain terminals or collector terminals can be arranged with parallel and aligned edges in a common first plane. The two source terminals or emitter terminals can be arranged with parallel and aligned edges in a common second plane. Consequently, the electrical layers of the two semiconductor components of the half-bridge advantageously have a current-carrying capacity of identical magnitude and, within the housing, planar, uniform contours having rectilinear edges, which, with regard to delamination and cracking, are more resistant to thermomechanical stress than conventional semiconductor module packages.

In a further advantageous configuration of the semiconductor module, within the housing a first drain terminal or collector terminal can be connected via a contacting layer to a corresponding drain electrode or collector electrode of the first semiconductor component and a first source terminal or emitter terminal can be connected via a contacting layer to a corresponding source electrode or emitter electrode of the first semiconductor component and a first gate terminal or base terminal can be connected via a contacting layer to a corresponding gate electrode or base electrode of the first semiconductor component. Moreover, within the housing a second drain terminal or collector terminal can be connected via a contacting layer to a corresponding drain electrode or collector electrode of the second semiconductor component and a second source terminal or emitter terminal can be connected via a contacting layer to a corresponding source electrode or emitter electrode of the second semiconductor component and a second gate terminal or base terminal can be connected via a contacting layer to a corresponding gate electrode or base electrode of the second semiconductor component. Advantageously, only the gate terminals or base terminals of the two semiconductor components can be electrically contacted with a printed circuit board, such that only drive signals of low power are conducted via the printed circuit board. The high-power currents flow via the current path which is arranged outside the housing and which is formed by the contact extensions not contacted with the printed circuit board and by the contact element.

In a further advantageous configuration of the semiconductor module, an end section of a phase current wire of an electrical machine can form the contact element. As a result, the same end section of the phase current wire which is directly connected to the phase potential tap of the proposed semiconductor module can close the current bridge between the first semiconductor and the second semiconductor.

In a further advantageous configuration of the semiconductor module, the housing can be embodied as a molded housing. Moreover, an outwardly facing open surface of the two first electrical conduction elements can terminate in each case flush with an underside of the housing. Furthermore, an outwardly facing open surface of the two second electrical conduction elements can terminate in each case flush with a top side of the housing. As a result, the housing can advantageously be placed simply by its underside onto a printed circuit board or a heat sink. Alternatively, the housing can be placed by way of its top side simply onto the printed circuit board or the heat sink. Moreover, it is possible to place the housing by its underside onto the printed circuit board and additionally to place the heat sink onto the top side of the housing.

Exemplary embodiments of the invention are illustrated in the drawing and are explained in greater detail in the following description. In the drawing, identical reference signs designate components or elements that implement identical or analogous functions.

DETAILED DESCRIPTION

Figure 1:
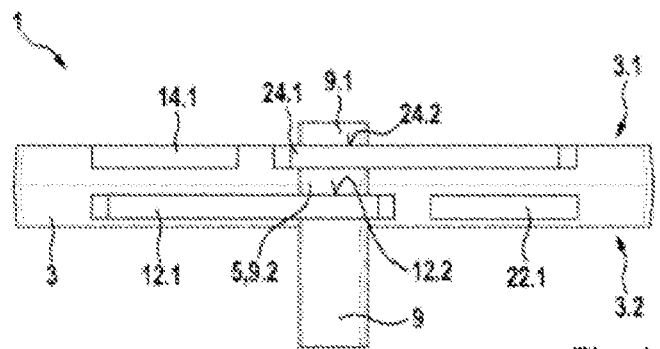
FIG. 1 shows a schematic side view of a first exemplary embodiment of a semiconductor module according to the invention in a slug-up design.

As is evident from FIGS. 1 to 8, the illustrated exemplary embodiments of a semiconductor module 1 according to the invention in each case comprise at least two semiconductor components 10, 20 which are arranged within a housing 3 in each case between two electrical conduction elements 12, 14, 22, 24 and are electrically conductively connected to the electrical conduction elements 12, 14, 22, 24. In this case, the electrical conduction elements 12, 14, 22, 24 respectively have a contact extension 12.1, 14.2, 22.1, 24.1 that is led out of the housing 3. Moreover, two contact extensions 12.1, 24.1 arranged in different planes are connected to one another outside the housing 3 via a contact element 5, which forms a current path between the two contact extensions 12.1, 24.1 outside the housing 3.

As is furthermore evident from FIGS. 1 to 8, the contact element 5 extends substantially perpendicularly between the two contact extensions 12.1, 24.1. The contact element 5 is connected for example to the contact extensions 12.1, 24.1 by means of soldering, resistance or laser welding, insulation-displacement connection, crimping or press-fit connection.

As is furthermore evident from FIGS. 1 to 8, the illustrated exemplary embodiments of the semiconductor modules 1 in each case form an electronic power module comprising a half-bridge circuit which has a high electrical and thermal loading capacity and is composed of two semiconductor components 10, 20 in an integral housing 3, which is directly connected to a phase current wire 9 of an excitation winding of a connected electrical machine (not illustrated). In the exemplary embodiments illustrated, the two semiconductor components 10, 20 are embodied as MOSFETs (Metal-Oxide-Semiconductor Field-Effect Transistors) having the same area requirement. In an alternative exemplary embodiment (not illustrated), the two semiconductor components 10, 20 can be embodied as IGBTs (Insulated Gate Bipolar Transistors).

Figure 3:
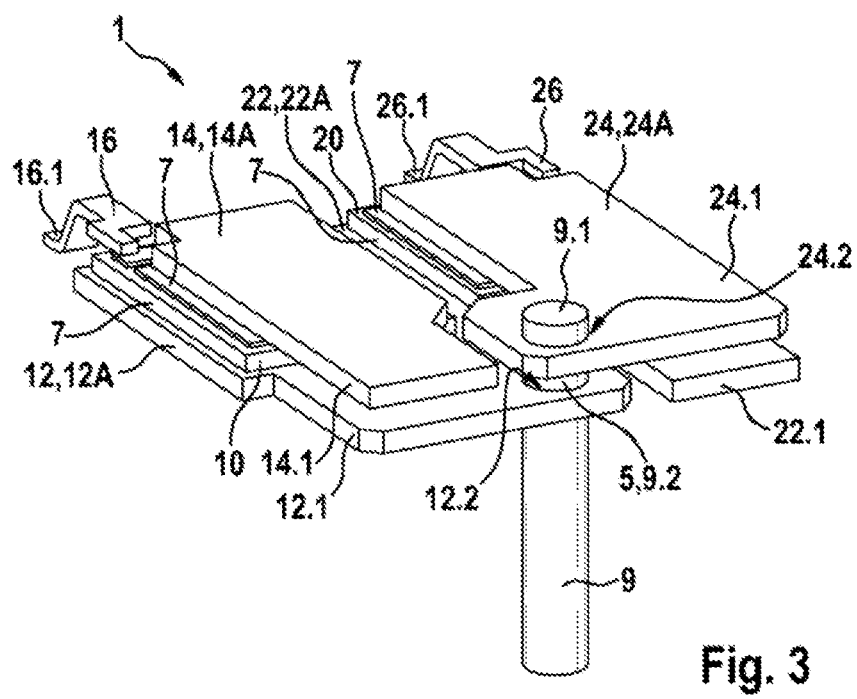
FIG. 3 shows a schematic perspective plan view of the exemplary embodiment of the semiconductor module according to the invention from FIGS. 1 and 2 without a housing.
Figure 4:
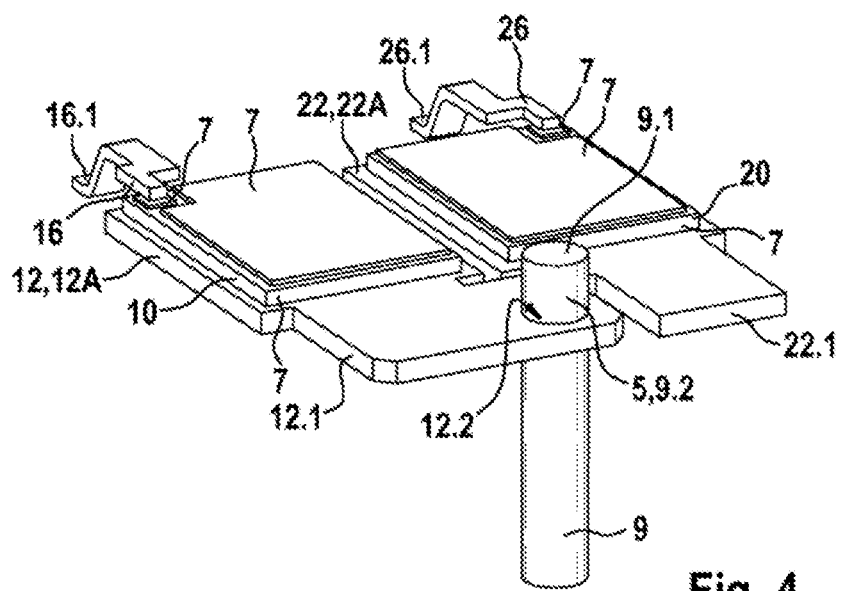
FIG. 4 shows a schematic perspective plan view of the exemplary embodiment of the semiconductor module according to the invention from FIG. 3 without a second electrical conduction element.

FIGS. 3 and 4 show the internal details of the semiconductor module 1 without the housing 3 thereof. As is furthermore evident from FIGS. 3 and 4, a first electrical conduction element 12 of a first semiconductor 10 and a first electrical conduction element 22 of a second semiconductor 20 are formed in each case as a drain terminal 12A, 22A. Moreover, a second electrical conduction element 14 of the first semiconductor 10 and a second electrical conduction element 24 of the second semiconductor 20 are formed in each case as a source terminal 14A, 24A. In this case, the two drain terminals 12A, 22A are arranged with parallel and aligned edges in a common first plane. The two source terminals 14A, 24A are arranged with parallel and aligned edges in a common second plane. As is furthermore evident from FIGS. 3 and 4, a first drain terminal 12A is connected via a contacting layer 7 to a corresponding drain electrode of the first semiconductor component 10. A first source terminal 14A is connected via a contacting layer 7 to a corresponding source electrode of the first semiconductor component 10. A first gate terminal 16 is connected via a contacting layer 7 to a corresponding gate electrode of the first semiconductor component 10. Moreover, a second drain terminal 22A is connected via a contacting layer 7 to a corresponding drain electrode of the second semiconductor component 20. A second source terminal 24A is connected via a contacting layer 7 to a corresponding source electrode of the second semiconductor component 20. A second gate terminal 26 is connected via a contacting layer 7 to a corresponding gate electrode of the second semiconductor component 20. The contacting layers 7 can be formed for example as solder layers, conductive adhesive layers, etc.

The layer construction "drain terminal-contacting layer-semiconductor component-contacting layer-source terminal" of the first "low-side" bridge path is embodied electrically symmetrically with respect to the layer construction "drain terminal-contacting layer-semiconductor component-contacting layer-source terminal" of the second "high-side" bridge path. Contrary to the conventional way of closing the current bridge between the first drain terminal 12A and the second source terminal 24A by means of a soldered connector or bond wire within the housing 3, a connection of the contact extension 12.1 of the first drain terminal 12A and of the contact extension 24.1 of the second source terminal 24A by an end section 9.1 of the phase current wire 9 is proposed. This connection can be produced by means of soldering, resistance or laser welding, insulation-displacement connection, crimping or press-fit connectors, since it is arranged outside the housing 3 embodied as a molded housing. A center point of a phase wire section 9.2 forms the phase potential tap. The latter divides the current path of the half-bridge electrically symmetrically into a "low-side" path and a "high-side" path of identical impedance, having a low inductance and also a low contact element resistance.

Figure 5:
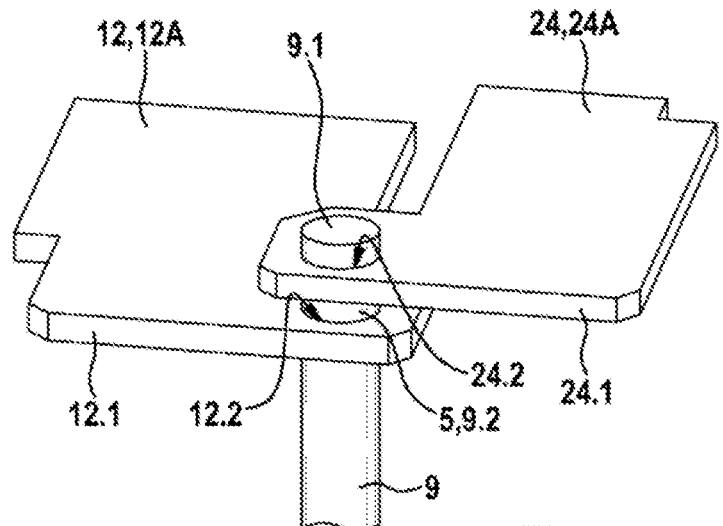
FIG. 5 shows a schematic perspective illustration of one exemplary embodiment of a current path between a first electrical conduction element of a first semiconductor and a second electrical conduction element of a second semiconductor of the semiconductor module according to the invention from FIGS. 1 to 4.
Figure 6:
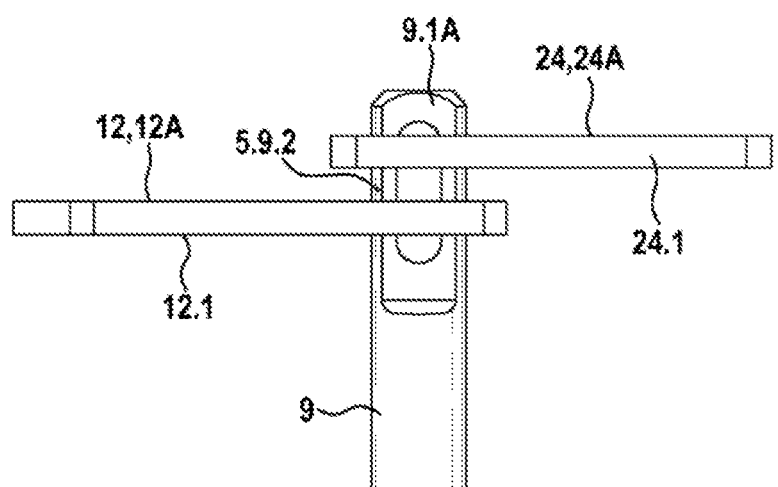
FIG. 6 shows a schematic illustration of a further exemplary embodiment of the current path from FIG. 5.

As is furthermore evident from FIGS. 5 and 6, in particular, an end section 9.1 of a phase current wire 9 of an electrical machine forms the contact element 5. As is furthermore evident from FIG. 6, the end section 7.1 of the phase current wire 9 is embodied as a press-fit eye 9.1A, which is press-fitted into corresponding contact openings 12.2, 24.2 in the contact extension 12.1 of the first drain terminal 12A and in the contact extension 24.1 of the second source terminal 24A.

Figure 2:
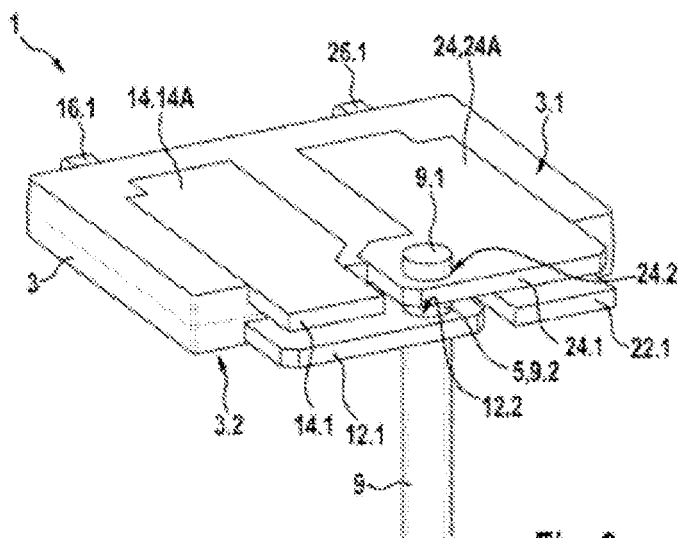
FIG. 2 shows a schematic perspective plan view of the exemplary embodiment of the semiconductor module according to the invention from FIG. 1.

As is furthermore evident from FIGS. 1 and 2, in the case of a slug-up design of the semiconductor module 1, a top side 3.1 of the housing 3 terminates flush with outer, open surfaces of the two source terminals 14A, 24A arranged parallel and in alignment, which can be connected to a heat sink (not illustrated in more specific detail) by way of a thermally conductive, electrically isolating intermediate medium. An underside 3.2 of the housing 3 is formed exclusively by a molding compound of the housing 3. The underside 3.2 of the housing 3 is electrically floating and can be connected to a circuit carrier (not illustrated in more specific detail) in a technically advantageous manner by means of a permanently elastic adhesive that exhibits operational durability over its lifetime. The circuit carrier can be embodied as a multilayered printed circuit board, for example. The circuit carrier and the housing 3 of the semiconductor module 1 can thus undergo thermomechanical elongations without cracking and delamination despite different coefficients of thermal expansion. Only the contact extensions 16.1, 26.1 of the gate terminals 16, 26 are electrically connected to the circuit carrier. However, high currents flow only through the contact extensions 12.1, 24.1 of the semiconductor module 1 and the phase current wire 9, and not through the circuit carrier. The contact element power loss in the electric flow field of the semiconductor module 1 therefore flows away predominantly through the open surfaces of the drain terminals 14A, 24A into the heat sink. The circuit carrier and the surrounding components arranged thereon are subjected to only slight thermal and thermomechanical loading.

Figure 7:
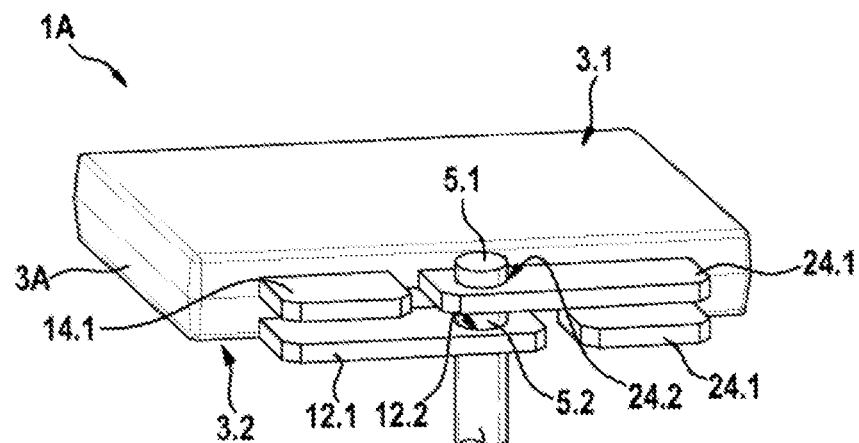
FIG. 7 shows a schematic perspective plan view of a second exemplary embodiment of a semiconductor module according to the invention in a slug-down design.
Figure 8:
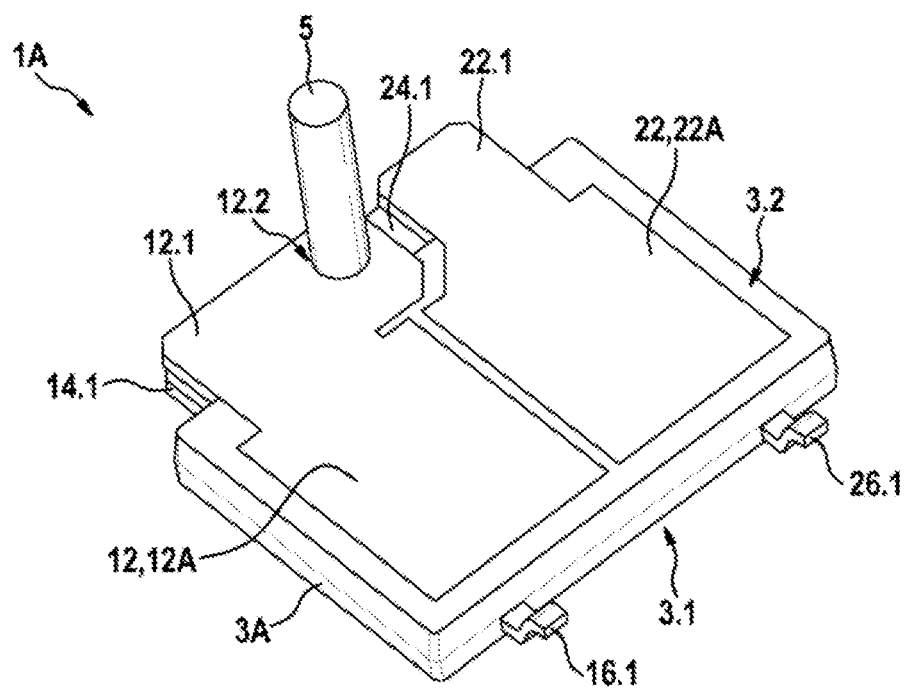
FIG. 8 shows a schematic perspective view of the second exemplary embodiment of the semiconductor module according to the invention from FIG. 7 from below.

As is furthermore evident from FIGS. 7 and 8, in the case of a slug-down design of the semiconductor module 1, the underside 3.2 of the housing 3 terminates flush with outer, open surfaces of the two drain terminals 12A, 22A arranged parallel and in alignment. One of the two open surfaces of the drain terminals 12A, 22A can be soldered to a solder surface on the circuit carrier, such that a high-side current or a low-side current can flow via the circuit carrier. Furthermore, one of the two open surfaces of the drain terminals 12A, 22A can be connected to a rectangularly periodic or hexagonal arrangement of thermal vias in the circuit carrier by way of a plastic, thermally conductive and electrically insulating intermediate medium, which arrangement can pass a heat flow of the semiconductor module 1 into a heat sink (not illustrated). The top side 3.1 of the housing 3 is formed exclusively by the molding compound of the housing 3.

The invention claimed is:

1. A semiconductor module comprising a first and a second semiconductor component,
   wherein the first and the second semiconductor components are arranged in a housing and form a half-bridge circuit,
   wherein the first semiconductor component includes:
   (i) a first contact extension that extends from the housing, the first contact extension being a drain terminal or a collector terminal, and
   (ii) a first contact being a source terminal or an emitter terminal;

wherein the second semiconductor component includes:
(i) a second contact extension that extends from the housing, the second contact extension being a source terminal or an emitter terminal, and
(ii) a second contact being a drain terminal or a collector terminal;
wherein the first and the second contact extensions are arranged in different planes and are connected to one another outside the housing by a wire to form a phase tap of the half-bridge circuit, and
wherein the wire passes through the first and second contact extensions.

2. The semiconductor module as claimed in claim 1, characterized in that the first and the second contact extensions are connected to the wire by soldering, resistance or laser welding, insulation-displacement connection, crimping or press-fit connection.

3. The semiconductor module as claimed in claim 1, characterized in that the first and second semiconductor components are power semiconductor components that have a same area requirement, and
wherein the half-bridge circuit is configured to be used with an electrical machine.

4. The semiconductor module as claimed in claim 1, characterized in that the first contact extension and the second contact are arranged with parallel and aligned edges in a common first plane.

5. The semiconductor module as claimed in claim 1, characterized in that the first contact and the second contact extension are arranged with parallel and aligned edges in a common second plane.

6. The semiconductor module as claimed in claim 1, characterized in that within the housing:
the first contact extension is connected via a first contacting layer to a drain electrode or collector electrode connected to the first semiconductor component,
the first contact is connected via a second contacting layer to a source electrode or emitter electrode connected to the first semiconductor component, and
wherein a first gate terminal or base terminal is connected via a third contacting layer to a gate electrode or base electrode of the first semiconductor component.

7. The semiconductor module as claimed in claim 1, characterized in that within the housing:
the second contact is connected via a fourth contacting layer to a drain electrode or collector electrode connected to the second semiconductor component,
the second contact extension is connected via a fifth contacting layer to a source electrode or emitter electrode connected to the second semiconductor component, and
wherein a second gate terminal or base terminal is connected via a sixth contacting layer to a gate electrode or base electrode of the second semiconductor component.

8. A system including an electrical machine and a semiconductor module according to claim 1, the electrical machine comprising a phase current wire having an end section, and wherein the end section of the phase current wire forms the wire of the phase tap.

9. The semiconductor module as claimed in claim 1, characterized in that the housing is embodied as a molded housing.

10. The semiconductor module as claimed in claim 1, characterized in that outwardly facing open surfaces of the first contact extension and of the second contact are flush with an underside of the housing.

11. The semiconductor module as claimed in claim 10, characterized in that the housing is placed by the underside onto a printed circuit board or a heat sink.

12. The semiconductor module as claimed in claim 1, characterized in that outwardly facing open surfaces of the first contact and of the second contact extension are flush with a top side of the housing.

13. The semiconductor module as claimed in claim 12, characterized in that the housing is placed by the top side onto a printed circuit board or a heat sink.

14. A semiconductor module comprising a first and a second semiconductor component,
wherein the first and the second semiconductor components are arranged in a housing and form a half-bridge circuit,
wherein the first semiconductor component includes:
(i) a first contact extension that extends from the housing, the first contact extension being a drain terminal or a collector terminal, and
(ii) a first contact being a source terminal or an emitter terminal;
wherein the second semiconductor component includes:
(i) a second contact extension that extends from the housing, the second contact extension being a source terminal or an emitter terminal, and
(ii) a second contact being a drain terminal or a collector terminal;
wherein the first and the second contact extensions are arranged in different planes and are connected to one another outside the housing to form a phase tap of the half-bridge circuit, characterized in that within the housing:
the first contact extension is connected via a first contacting layer to a drain electrode or collector electrode connected to the first semiconductor component,
the first contact is connected via a second contacting layer to a source electrode or emitter electrode connected to the first semiconductor component, wherein a first gate terminal or base terminal is connected via a third contacting layer to a gate electrode or base electrode of the first semiconductor component
the second contact is connected via a fourth contacting layer to a drain electrode or collector electrode connected to the second semiconductor component,
the second contact extension is connected via a fifth contacting layer to a source electrode or emitter electrode connected to the second semiconductor component, wherein a second gate terminal or base terminal is connected via a sixth contacting layer to a gate electrode or base electrode of the second semiconductor component, and
wherein only the first gate terminal or base terminal and the second gate terminal or base terminal are electrically contacted with a printed circuit board.

* * * * *